United States Patent [19]
Yamashita et al.

[11] Patent Number: 5,745,506
[45] Date of Patent: Apr. 28, 1998

[54] ERROR CORRECTING DECODER

[75] Inventors: Syugo Yamashita, Osaka; Yoshikazu Tomida, Hirakata; Masayuki Takada, Tokyo; Toru Kuroda, Tokyo; Tadashi Isobe, Tokyo; Osamu Yamada, Tokyo, all of Japan

[73] Assignees: Sanyo Electric Co., Ltd., Osaka; Nippon Hoso Kyokai, Tokyo, both of Japan

[21] Appl. No.: 449,916

[22] Filed: May 25, 1995

[30] Foreign Application Priority Data

May 25, 1994 [JP] Japan .................................... 6-110798

[51] Int. Cl.$^6$ ............................................. H03M 13/00
[52] U.S. Cl. ................................................... 371/37.9
[58] Field of Search ............................. 371/37.1–37.9, 371/38.1, 39.1

[56] References Cited

U.S. PATENT DOCUMENTS

| | | |
|---|---|---|
| 4,404,674 | 9/1983 | Rhodes .................................... 371/43 |
| 4,630,271 | 12/1986 | Yamada .................................. 371/37.9 |
| 4,660,199 | 4/1987 | Maeda et al. ............................ 371/36 |

FOREIGN PATENT DOCUMENTS

| | | |
|---|---|---|
| 64-62027 | 3/1989 | Japan . |
| 6469027 | 3/1989 | Japan . |

*Primary Examiner*—Reba I. Elmore
*Assistant Examiner*—Emmanuel L. Moise
*Attorney, Agent, or Firm*—Nikaido, Marmelstein, Murray & Oram LLP

[57] ABSTRACT

An error correcting decoder includes a flag memory (20) which stores a flag indicative of a success of an error correction for a bit. When a column direction error correction is to be performed, if a flag for a bit indicates a success, no error correction is performed for the bit. That is, an output of a majority logic circuit (78) is forcedly made invalid. In performing the column direction error correction, if the number of success packets in a first-time row direction error correction is smaller than a predetermined value and if the number of bits corrected by the column direction error correction becomes equal to or larger than a predetermined number, it is deemed as that the column direction error correction is unsuccessful. In performing a second-time row direction error correction, when a threshold value is equal to or larger than a predetermined value, the majority logic circuit determines with referring to a result of the column direction error correction, but without referring to the result when the threshold value is smaller than the predetermined value.

7 Claims, 6 Drawing Sheets

ERROR CORRECTING DECODER

BACKGROUND OF THE INVENTION

1. Field of the Invention

The present invention relates to an error correcting decoder. More specifically, the present invention relates to an error correcting decoder which is utilized in a mobile FM multiplex broadcasting receiver or FM subcarrier data receiver, and utilizes a majority logic decoding method and a decoding method to which a principle of the majority logic decoding method is applied so as to decode a product code encoded by a (272, 190) shortened difference set cyclic code.

2. Description of the Prior Art

One example of a conventional error correcting decoder is disclosed in, for example, Japanese Patent Application Laying-open No. 64-62027 laid open on Mar. 8, 1989. With referring to FIG. 1 of Japanese Patent Application Laying-open No. 64-62027, in this prior art, first, data is loaded in a data register (19), and a syndrome register (15) is loaded with a parity packet after the syndrome register (15) is reset at a time that the loading of the data is started. Then, when the data of 272 bits is loaded in the data register (19), a switch (13) arranged at a front stage of the data register (19) is switched so as to make the data register (19) cycle.

On the other hand, a suitable number of bits out of 82 bits of the parity packet are input to an exclusive OR gate (16) from the syndrome register (15) which is equal to a syndrome sum calculation circuit, and 17 (seventeen) syndrome calculation formulas are arithmetically operated in the exclusive OR gate (16), and 17 (seventeen) syndrome values are applied to a variable threshold circuit (17) which is equal to a majority logic circuit. Then, a threshold value of "15", for example, is first set in a variable threshold circuit (17), and according to a result of a modulo-calculation for a starting bit of the data register (19), an error correction of the data and a modification of the syndrome register (15) are performed. Such an operation is performed for each of the 272 bits. If the operations for the 272 bits are completed, similar operations are repeated with making the threshold value of the variable threshold value circuit (17) small until a time that the threshold value becomes "9".

Then, if all contents of the syndrome registers (15) are not zero after the completion of the error correction, it is determined that the error correction is unsuccessful, and then, an error flag is output from an error flag circuit (18).

In this prior art, a probability of erroneous correction becomes large, and an error-correctability becomes small. More specifically, in the majority logic decoding method which is utilized in the error correcting decoder for the (272, 190) shortened difference set cyclic code, because the syndrome register is affected by the correction of the bit to be determined, in a case where the correction is erroneously applied to the bit which has been determined to be correct according to the majority logic determination, an influence due to such an erroneous correction is extended to succeeding bits. Therefore, by erroneously performing the correction with respect to the bit which has been determined to be correct, inversely, the probability of erroneous correction becomes large, and the error-correctability is made small.

SUMMARY OF THE INVENTION

Therefore, a principal object of the present invention is to provide an error correcting decoder capable of making the probability of erroneous correction small.

Another object of the present invention is to provide an error correcting decoder capable of increasing the error-correctability.

In a first aspect, the present invention is an error correcting decoder which decodes a code with utilizing a majority logic decoding method characterized in that an error correction is deemed to be unsuccessful if the number of corrected bits included in the code is larger than a first predetermined number.

In a second aspect, the present invention is an error correcting decoder which performs an error correction for data having frame structure which is encoded into a product code by a cyclic code capable of being decoded by a majority logic and composed of packets each of which includes a code or a combination of code having a high error-correctability characterized in that the error correcting decoder comprises a first flag memory which stores a first flag indicative of a result of an error correction in a row direction, and that at a time that an error correction in a column direction is to be performed after the error correction in the row direction, no error correction is performed with respect to a bit to be determined if the first flag corresponding to the bit to be determined indicates that the error correction in the row direction is successful.

In a third aspect, the present invention relates to an error correcting decoder which performs an error correction for data having frame structure which is encoded in a product code by a cyclic code capable of being decoded by a majority logic and composed of packets each of which includes a code or a combination of codes having a high error-correctability characterized in that the error correcting decoder comprises a second flag memory which stores a second flag indicative of a result of an error correction, and a majority logic means which determines whether or not an error correction for each of bits constituting a packet is needed, and that if a threshold value which is utilized for determination by the majority logic means is equal to or larger than a fourth predetermined value, the determination is performed with referring to the second flag, and if the threshold value is smaller than the fourth predetermined value, the determination is performed without referring to the second flag.

In the first aspect, it is noted that if the number of the bits corrected by the error correction in the column direction becomes larger, the probability of erroneous correction becomes larger Then, by counting the number of correction signals each of which is output from the majority logic means and indicates that the error correction is needed, the number of corrected bits is counted. If and when the number of the corrected bits is equal to or larger than the first predetermined value, the error correction is forcedly deemed to be unsuccessful.

In the second aspect, by noting a result of the error correction in the row direction (hereinafter, may be simply called as "row direction error correction") having high error-correctability, and the result of the row direction error correction is respected. Furthermore, in a situation that the row direction error corrections are unsuccessful with respect to most packets, the number of the corrected bits corrected by the error correction in the column direction (hereinafter, may be simply called as "column direction error correction") becomes large. Similar to the first aspect, in such a case, it is noted that the probability that the result of the column direction error correction also becomes large.

More specifically, after the row direction error correction, at a time that the column direction error correction is to be performed, if a result of the row direction error correction, i.e. the first flag corresponding to the bit to be determined indicates that the row direction error correction for a bit to be determined is successful, the column direction error correction is not performed for the bit to be determined. At that time, an output of the majority logic means is forcedly made invalid, for example. Furthermore, before performing the column direction error correction, the number of successful packets by the row direction error correction is counted by a first counting means, and if a count value thereof is smaller than a second predetermined value, the number of the corrected bits corrected by the column direction error correction is further counted by a second counting means. If a count value of the second counting means is equal to or larger than a third predetermined value, the column direction error correction is deemed to be unsuccessful. Then, with suppressing the probability of erroneous correction, the column direction error correction and the decoding are performed.

In the third aspect, at a time that the row direction error correction is to be performed after the column direction error correction, for example, when the threshold value of the majority logic means is equal to or larger than the fourth predetermined value, it is determined, with referring to a result of the column direction error correction, i.e. the second flag, whether or not the row direction error correction is needed, and if the threshold value of the majority logic means is smaller than the fourth predetermined value, it is determined, without referring to the result of the column direction error correction, whether or not the row direction error correction is needed.

In accordance with the present invention, in the column direction error correction after the row direction error correction, or in the row direction error correction after the column direction error correction, the error-correctability is increased. Furthermore, in the column direction error correction after the row direction error correction, the probability of erroneous correction also becomes small.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
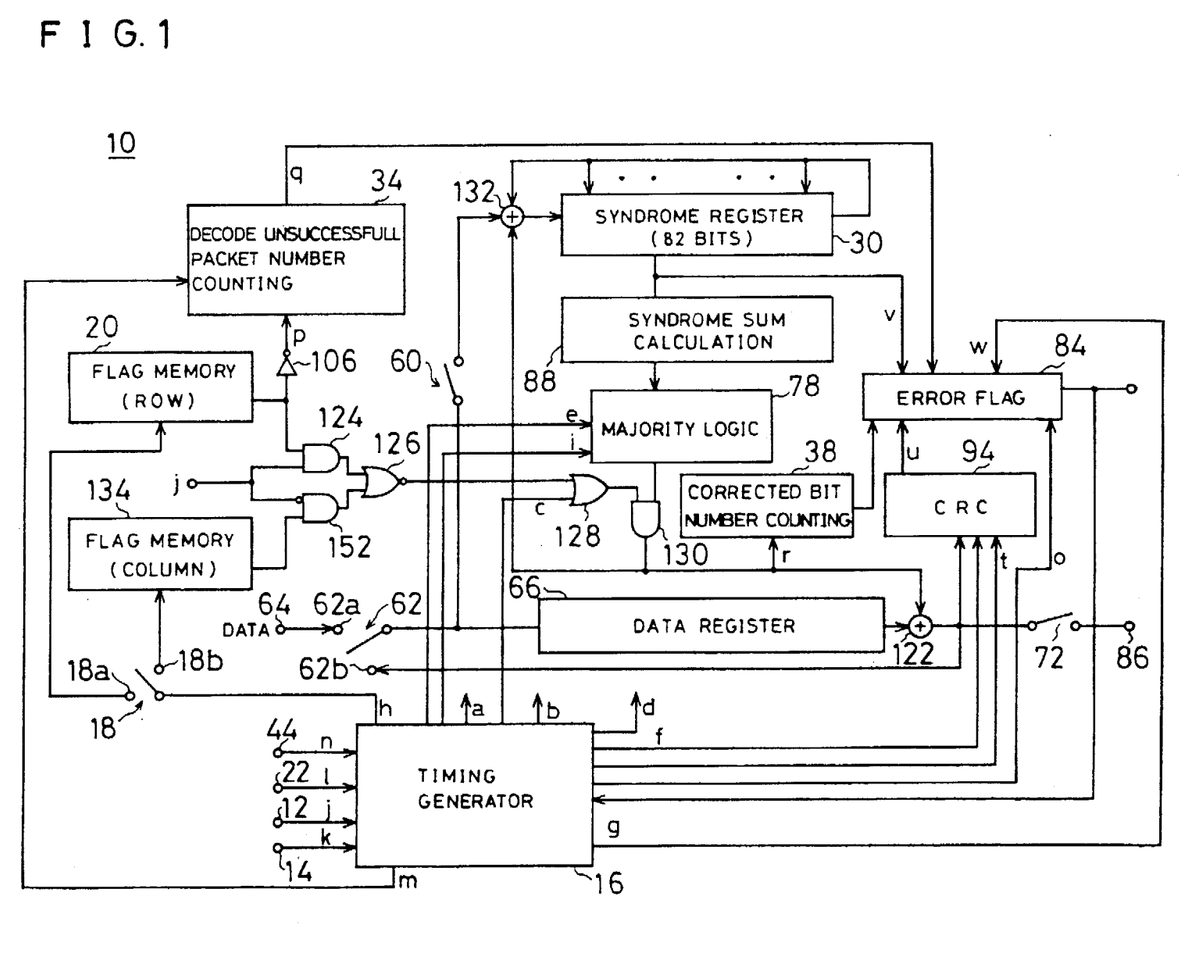
FIG. 1 is a block diagram showing one embodiment according to the present invention.

FIG. 1 shows structure of an error correcting decoder 10 of this embodiment according to the present invention, and the structure and an operation of this embodiment shown will be described with referring to FIG. 1 to FIG. 5.

In the error correcting decoder 10, by utilizing a majority logic decoding method as a decoding method for decoding a (272, 190) shortened difference set cyclic code, it is possible to correct a code word one by one bit with cyclically shifting the word.

In addition, prior to performing a column direction error correction, a signal j which is input from a terminal 12 and becomes a high level at a time that the column direction error correction is to be performed, and a signal k which is input from a terminal 14 and becomes a low level at a time that a first-time row direction error correction is to be performed are input to a timing generator 16 in advance. Furthermore, a switch 18 is switched to a terminal 18a such that an address h can be applied to a flag memory 20 which saves a result of the first-time row direction error correction. The flag memory 20 stores the result of the first-time row direction error correction as a flag. In the flag memory 20, a high level flag indicative of a success of the error correction is set in a case where both of the error correction and the CRC are successful, and otherwise, a low level flag indicative of an unsuccess of the error correction is set, as similar to a flag memory 134 (described later).

Figure 2:
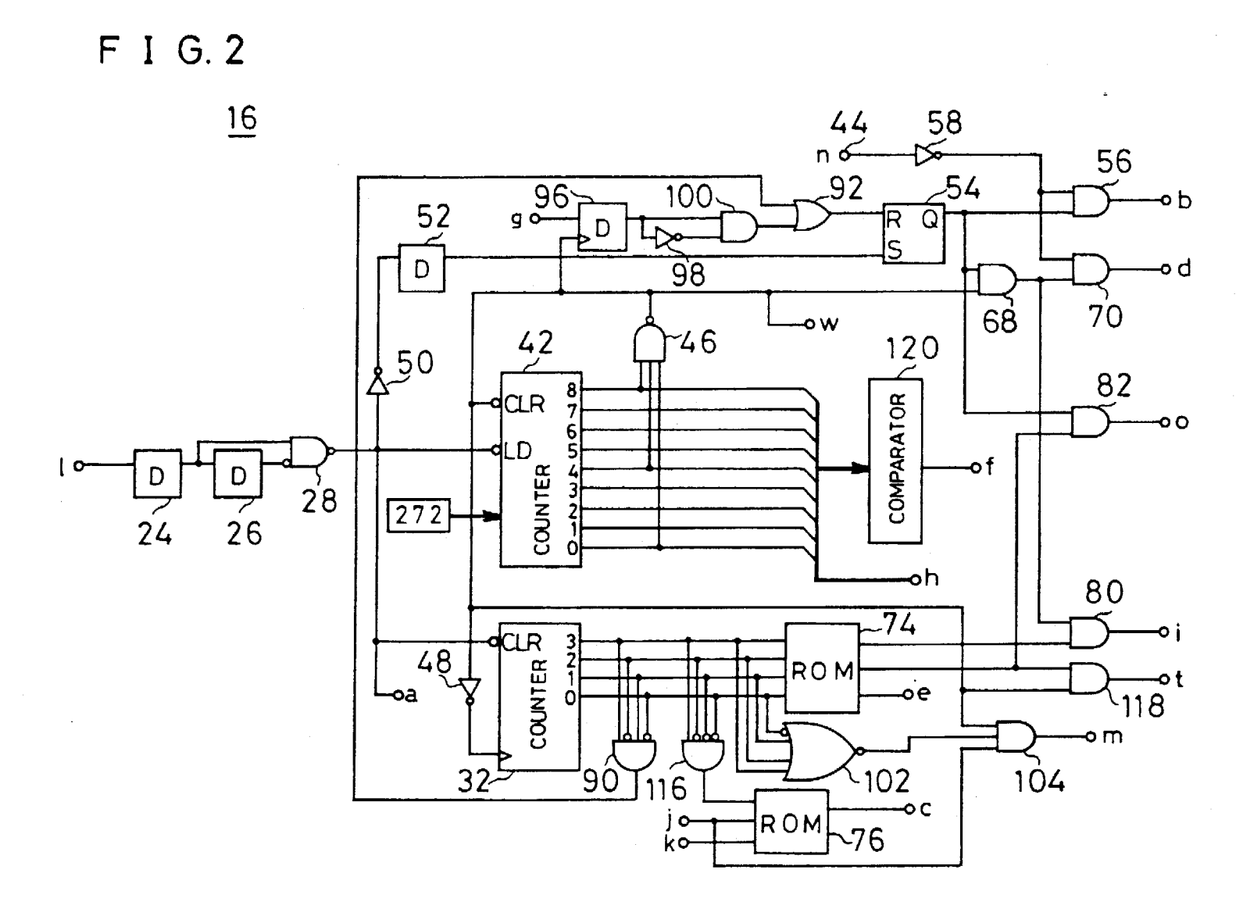
FIG. 2 is a circuit diagram showing one example of a timing generator.

First, if a decode start signal 1 is input from a terminal 22, an initialization signal a for initializing the error correcting decoder 10 is generated by D-FFs 24 and 26 and a gate 28 included in the timing generator 16 shown in FIG. 2, and each of a syndrome register 30, a counter 32 for counting the number of cyclic codes, a counter 36 within a decode-unsuccessful packet number counting circuit 34, and a counter 40 within a corrected bit number counting circuit 38 is cleared with zero.

A synchronous counter 42 of 9 bits, which is cleared at every 273 bits, is loaded with 272 bits at a leading edge of an interior clock n which is inputted from a terminal 44 and has a very high speed. As a result of such a loading, an output signal w, i.e. a clear signal from a 3-input NAND gate 46 (FIG. 2) becomes a low level, and the counter 42 is cleared with zero at the leading edge of the interior clock n. Furthermore, such a clear signal w is applied to the counter 32 through a NOT gate 48 as a count-up signal, and therefore, the counter 32 is incremented or counted-up. Furthermore, the initialization signal a is also applied to an RS-FF 54 (FIG. 2) through a NOT gate 50 and a D-FF 52 as a set input, and therefore, the RS-FF 54 is made its set state. An inverted signal of the clock n is applied to an AND gate 56 through a NOT gate 58, and the inverted signal of the clock n is gated with an output of a Q terminal of the RS-FF 54. An output b of the AND gate 56 is applied to the syndrome register 30 which is then shifted by one bit a right direction at a leading edge of the output b. After that, a switch 60 (FIG. 1) is turned-on, and a switch 62 is switched to a terminal 62a, and accordingly, a code word of the (272, 190) shortened difference set cyclic code is loaded to the syndrome register 30 from a terminal 64 in synchronous with the signal b. A signal d for shifting a data register 66 (FIG. 1) is made in a low level by AND gates 68 and 70 at a time that the counter 42 indicates "272", that is, at a time that the output signal w of the 3-input NAND gate 46 becomes a low level; however, otherwise, the signal d becomes the same waveform as the waveform of the signal b.

In addition, the syndrome register 30 is a division circuit having a feed-back function, and the syndrome register 30 indicates a specific value being not zero after the data of the 272 bits is loaded thereto in a case where the data is not a code word of the (272, 290) code. Furthermore, there is a case where the data register 66 is constructed with 190 bits according to system structure; however, in this embodiment shown, in order to simplify, the data register 66 is constructed by a shift register of 272 bits. In addition, a switch 72 is maintained its off state until the success of the decode is confirmed.

Prior to a description of an operation for counting the number of the decode-unsuccessful packets at a time that the data is loaded, which is one of the features of this embodiment shown, the counter 32, and ROMs 74 and 76 are described.

The counter 32 is counted-up at every timing that the counter 42 indicates "272", and therefore, the counter 32 is capable of counting the number of cycles of the data register 66. The ROM 74 having an address which is determined by a value of the counter 32, according to the following table 1, outputs a threshold value e for a majority logic circuit 78 in accordance with the number of the cycles, a signal i which makes the majority logic circuit 78 in an active state through an AND gate 80, and a signal o which makes an error flag circuit 84 in an active state through an AND gate 82.

TABLE 1

Content of ROM 74

| Input Output from Counter 32 | Threshold Value e | Output Output to Gate 80 | Output to Gate 82 |
|---|---|---|---|
| 0 | 15 | L | L |
| 1 | 15 | L | L |
| 2 | 15 | H | H |
| 3 | 14 | H | H |
| 4 | 13 | H | H |
| 5 | 12 | H | H |
| 6 | 11 | H | H |
| 7 | 10 | H | H |
| 8 | 9 | H | H |
| 9 | 15 | L | H |
| 10 | 15 | L | L |

At a time that a count value of the counter 32 is "1", the data from the terminal 64 is loaded to the error correcting decoder 10, and at a time that the count value of the counter 32 indicates one of "2"–"8", the error correction is performed, and at a time that the counter 32 is "9", a switch 72 is turned-on such that data after decoding is output from a terminal 86 to an outside of the error correcting circuit 10, and at a time that the counter 32 indicates "10", an output of a gate 90 becomes a high level, and therefore, the RS-FF 54 is reset through an OR gate 92, and then, the decoding is completed.

In addition, in this embodiment shown, the following modification may be considered. Firstly, even if the count value of the counter 32 is a value smaller than "8", in a case where a value of the syndrome register 30 is "0" and a CRC check circuit 94 determines that the error correction is correct, a signal g which is output from the error flag circuit 84 and indicates the decode success becomes a high level, and therefore, the RS-FF 54 is reset through a D-FF 96, a NOT gate 98, an AND gate 100 and the OR gate 92. Then, after the completion of the cycle in which the signal g is changed to a high level, the switch 72 is turned-on, the data after decoding may be output from the terminal 86.

Figure 3:
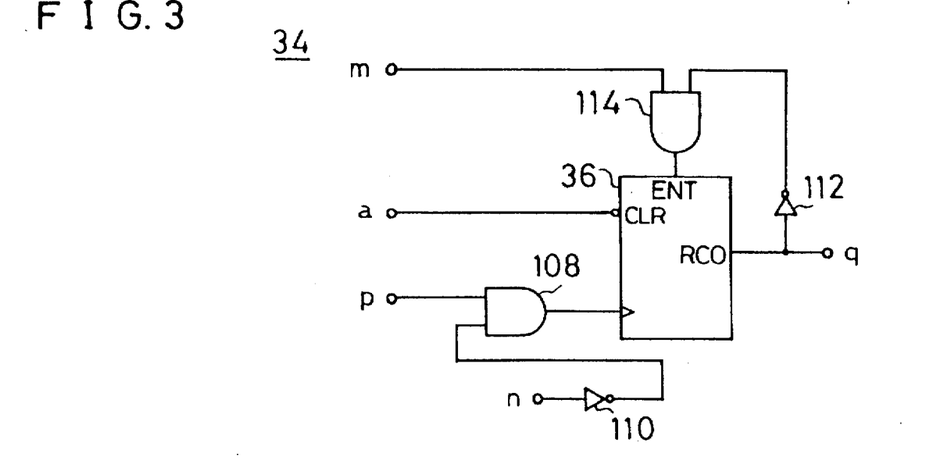
FIG. 3 is a circuit diagram showing one example of a decode-unsuccessful packet number counting circuit.

A calculation of the number of the decode-successful packets in the first-time row direction error correction prior to performing the column direction error correction is as follows:

In loading the data into the data register 66, that is, at a time that the count value of the counter 32 is "1", an output of a gate 102 becomes a high level, and a signal m from a 3-input AND gate 104 becomes a high level, and therefore, the counter 36 of the decode-unsuccessful packet number counting circuit 34 is made in its active state. Then, the address h for referring to a result of the row direction error correction for a packet which includes a bit input to the data register 66 is output from the counter 42. The address h is output to the flag memory 20 via the switch 18, and in response thereto, the flag memory 20 outputs the result of the row direction error correction for the bit. The result of the row direction error correction is applied to the decode-unsuccessful packet number counting circuit 34 as a signal p through a NOT gate 106. To an AND gate 108 of the decode-unsuccessful packet number counting circuit 34 which receives the signal p of the result of the row direction error correction, other than the signal p, the inverted signal of the interior clock n which is inverted by a NOT gate 110 is applied. Therefore, if the signal p is high level indicative of the unsuccess of the error correction, the counter 36 is counted-up. By accumulating the signal p of the high level, the number of the unsuccessful packets in the first-time row direction error correction can be counted. In a case where the number of the decode-unsuccessful packets in the row direction error correction is large at a degree that an RCO terminal of the counter 36 is made in a high level, a signal q is maintained in a high level state by a NOT gate 112 and an AND gate 114. In addition, if the signal j is a low level, that is, if the row direction error correction is to be performed, the signal q becomes a low level.

Then, after the completion of the data loading, an operation of the error correction is performed.

The ROM 76 outputs the signal c according to the following table 2. The signal c plays a function for gating a correction signal outputted from the majority logic circuit 78 in accordance with three modes including a first mode of a first-time row direction decoding, a second mode of a column direction decoding, and a third mode of a second-time row direction decoding after the column direction decoding.

As seen from the table 2, in the first mode, the signals j and k are both low levels, and therefore, irrespective of the count value of the counter 32, that is, irrespective of a low level or a high level of an output of the gate 116, the ROM 76 outputs the signal c of a high level. Furthermore, in the third mode, the signal j becomes a low level and the signal k becomes a high level, and therefore, if the count value of the counter 32 is other than "8", that is, if the output of the gate 116 is a low level, the ROM 76 outputs the signal c of a low level, and if the count value of the counter 32 is "8", that is, if the output of the gate 116 is a high level, the ROM 76 outputs the signal c of a high level. In addition, at a time that the count value of the counter 32 is "8", the threshold value e is a minimum value. Furthermore, in the second mode, the signal j becomes a high level, and therefore, the ROM 76 outputs the signal c of a low level irrespective of the count value of the counter 32. Furthermore, "d" shown in the table 2 has nothing to do with the determination of the signal c. Furthermore, the gate 116 outputs a high level signal only a time that the count value of the counter 32 indicates "8".

TABLE 2

Content of ROM 76

| Output of Gate 16 | Input Signal j | Signal k | Output Signal c |
|---|---|---|---|
| d | L | L | H |
| L | L | H | L |
| H | L | H | H |
| d | H | d | L |

The column direction error correction is started in response to a fact that the switch 60 is turned-off after the loading of the data of the 272 bits and the switch 62 is changed to the terminal 62b. After such operations, the signal i becomes a high level, and therefore, the majority logic circuit 78 which has been fixed at a state where the majority logic circuit 78 outputs a low level (invalid signal) by that time becomes active, and therefore, it becomes possible to output from the majority logic circuit 78 a signal other than a low level in accordance with a result of a majority determination with utilizing the output of the syndrome sum calculation circuit 88.

Then, only the syndrome register 30 is shifted by one bit in a right direction by the signal b because the (272, 190) shortened difference set cyclic code is originally a code obtained by shortening a (273, 191) difference set cyclic signal by one bit.

In performing the column direction error correction in a case where the error corrections of a large number of packets are successful in the first mode, i.e., first-time row direction error correction, that is, in a case where the signal q is a low level, the signal j is always a high level and the signal c is always a low level. Therefore, the decoding result of the first-time row direction decoding, which is outputted from the flag memory 20 and for the packet including the corrected bit, is applied to an AND gate 130 through an AND gate 124, a NOR gate 126 and an OR gate 128, and ANDed with the output of the majority logic circuit 78. Accordingly, even if the output of the majority logic circuit 78 is a high level by which the error correction is designated, when the output of the flag memory 20 is a high level, that is, the output of the flag memory 20 indicates the success of the error correction, the output of the AND gate 130 becomes a low level, and therefore, the low level output is applied to the exclusive OR gates 122 and 132, respectively, and accordingly, the syndrome register 30 and the data register 66 are merely cycled, respectively. That is, in only a case where the flag from the flag memory 20 indicates the success of the error correction, by forcedly making the output of the majority logic circuit 78 invalid (low level), a situation that no error correction is performed is implemented. The error correction operation by the exclusive OR gates 122 and 132 is performed at only a time that the output of the flag memory 20 is a low level (the unsuccess of the correction) and the output of the majority logic circuit 78 is a high level.

In addition, in the first mode, i.e. in the first-time row direction error correction, since the signal c always becomes a high level, irrespective of an output of the flag memory 134, the correction operation is performed according to the output of the majority logic circuit 78 because the switch 18 is switched to the terminal 18a in the row direction error correction. In the flag memory 134, respective correction results of the column direction error corrections with respect to a bit train of the frame in view from the column direction.

Figure 4:
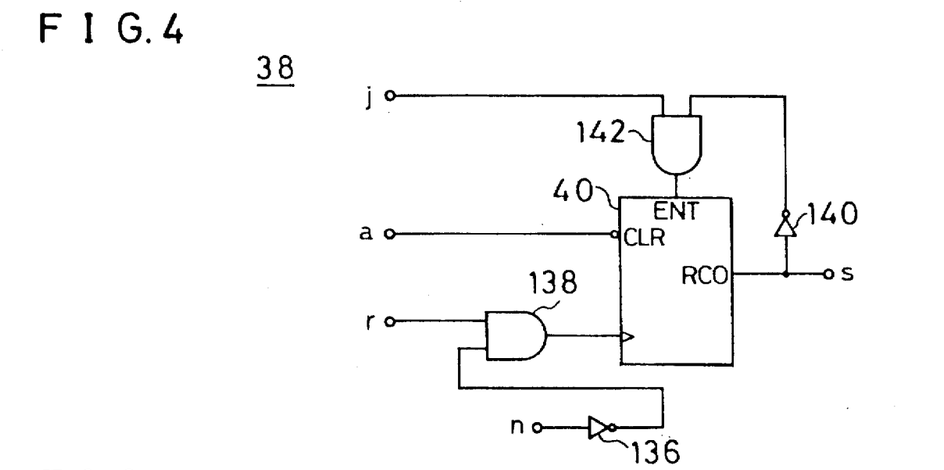
FIG. 4 is a circuit diagram showing one example of a corrected bit number counting circuit.

On the other hand, the error correction operation in a case where the error corrections of a large number of packets are unsuccessful in the first-time row direction error correction, that is, in a case of the high level of the signal q is basically the same as the operation in the above described case where the error correction of a large number of packets are successful; however, a condition that the decode becomes successful or unsuccessful is changed in accordance with the signal s outputted from the corrected bit number counting circuit 38. If a correction signal r of a high level is applied to an AND gate 138 of the corrected bit number counting circuit 38, the correction signal r is gated by the AND gate 138 with the inverted signal obtained by inverting the interior clock n by a NOT gate 136, and therefore, the counter 40 which counts the number of the corrected bits is counted-up. When the number of the corrected bits becomes a predetermined value, an RCO terminal of the counter 40 capable of being counted in performing the column direction error correction becomes a high level by the signal j, the signal s is maintained to be output in a high level via a NOT gate 140 and an AND gate 142, and therefore, the counter 40 is made in a hold state by the signal s. According to the signal s, the error flag circuit 84 changes the decode success condition.

Figure 5:
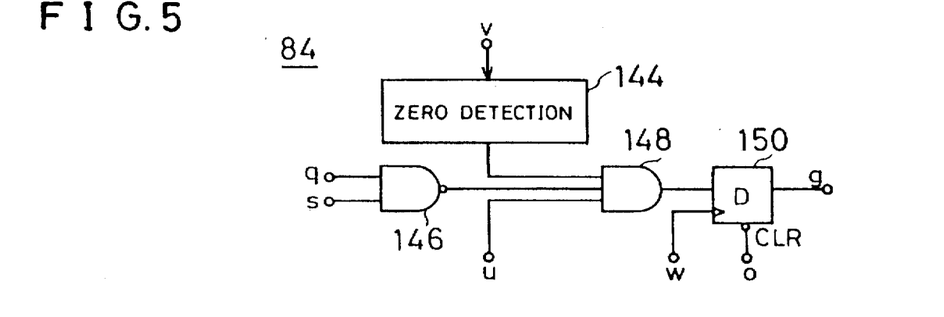
FIG. 5 is a circuit diagram showing one example of an error flag circuit.

A conventional error flag circuit is shown in FIG. 5. With referring to FIG. 5, the conventional error flag circuit determines whether or not the decode is successful on the basis of an output of a zero detection circuit 144 which outputs a high level at a time that a content v of the syndrome register is zero, and a CRC check result signal u inputted from the CRC check circuit. However, in the error flag circuit 84 utilized in this embodiment shown, the decode success condition is changed in accordance with two modes of the row direction and the column direction as shown in FIG. 5.

More specifically, in the conventional error flag circuit, if the output of the syndrome register becomes zero and the CRC check circuit determines to be correct, the decode is successful; however, such a condition can be applied to only the row direction error correction and the column direction error correction in a case where a large number of packets are successfully decoded in the first-time row direction error correction. The reason is as follows.

In performing the column direction error correction after the first-timd row direction error correction where the decode of a large number of packets are unsuccessful, the signal q becomes a high level. Then, if the number of the corrected bits in the column direction error correction is larger than a predetermined value, the signal s becomes a high level, and therefore, an output of a NAND gate 146 becomes a low level. Accordingly, even if the conventional decode success conditions are satisfied, it is determined by a 3-input AND gate 148 that the decode is not successful. In addition, a D-FF 150 is provided for preventing the decode success signal g from being erroneously made in a high level at a time of the data loading, or a time that the CRC check circuit 94 is reset for each cycle.

In addition, in performing the row direction error correction, the signal g is saved in a bit of the flag memory 20 for the row direction error correction corresponding to a packet (packet) for which the error correction is performed after the completion of the decoding operation. In performing the column direction error correction, the signal g is saved in a bit of the flag memory 134 for the column direction error correction corresponding to a column for which the error correction is performed, after the completion of the decoding operation.

Now, the CRC check circuit 94 will be described. When the output signal w of the 3-input NAND gate 46 becomes a low level, a signal t output from the AND gate 118 also becomes a low level, and therefore, the CRC check circuit 94 is cleared at a leading edge of the signal t. The CRC check circuit 94 which is thus reset by the signal t fetches, in the error correction operation, data from the exclusive OR gate 122 during a period at the output f of a comparator 120 indicates a high level, that is, during a period that the count value of the counter 42 indicates "0"–"189" so as to check the data. When the CRC check circuit 94 determines that the data is correct, the CRC check circuit 94 outputs the signal u of a high level to the error flag circuit 84.

The second-time row direction error correction after the column direction error correction, which is one of the features of the present invention, is not changed from the column direction error correction in a basic operation except the following points.

More specifically, first, the switch 18 is switched to the terminal 18b, and therefore, the correction result in the column direction which is stored in the flag memory 134 as a flag is outputted from a gate 152, and according to the correction result, the correction signal r output from the majority logic circuit 78 is controlled. In this point, the second-time row direction error correction is different from the column direction error correction. Furthermore, the second-time row direction error correction is different from in points that the decode-unsuccessful packet number counting circuit 34 is not operated, and that the signal c becomes a high level during a last cycle of the correction operation at a time that the threshold value e is "9", and therefore, an error correction is performed without referring to the prior correction result (flag memory 134).

In addition, the first-time row direction error correction is performed as similar to a conventional error correction, and the signal c always becomes high level, and therefore, the output of the majority logic circuit 78 is not influenced.

An operation of such the error correcting decoder 10 will be described more specifically with referring to FIG. 6 to FIG. 8.

First, with referring to FIG. 6, the column direction error correction in a case where the number of the decode-unsuccessful packets is small in the first-time row direction error correction will be described.

Figure 6:
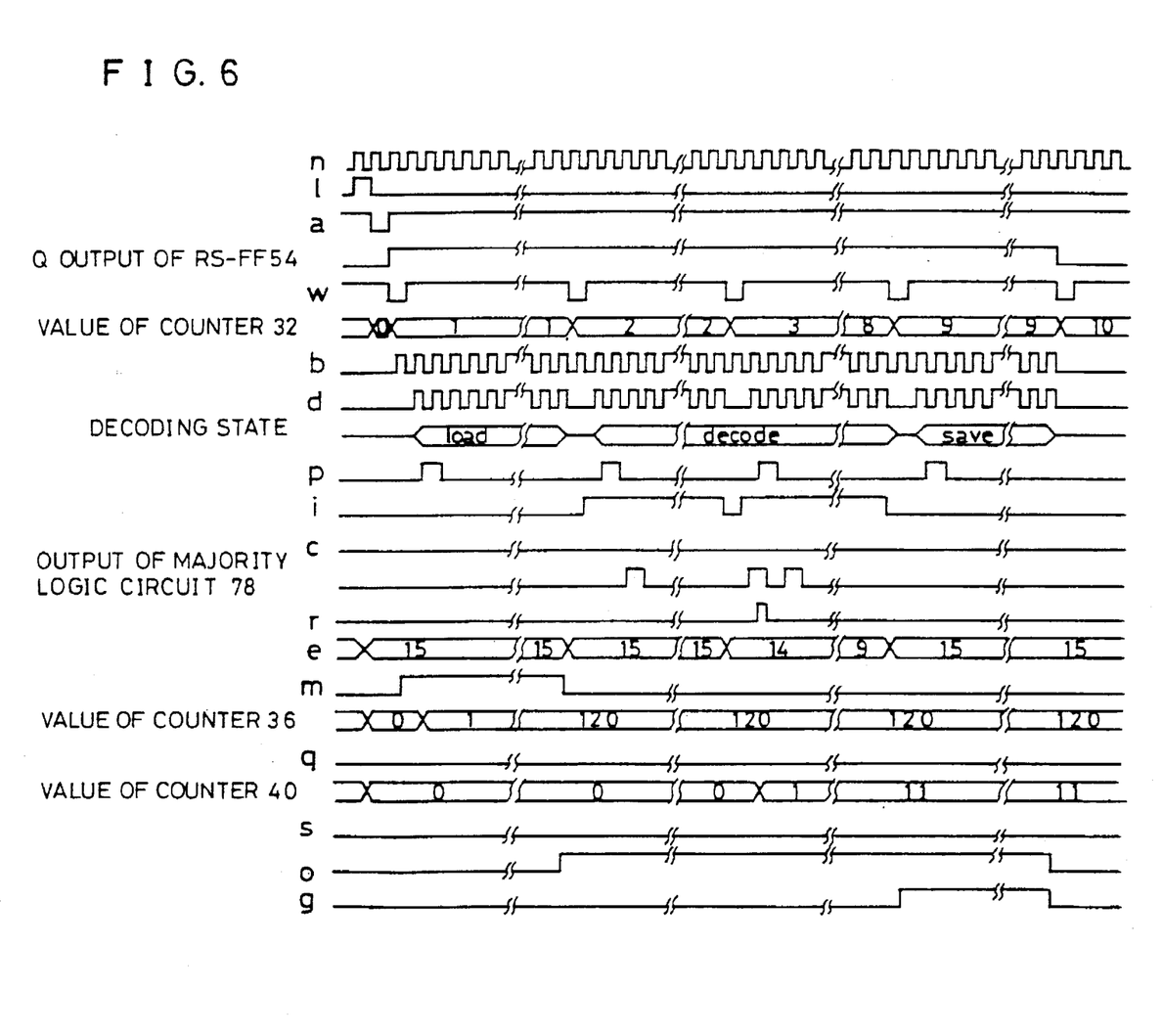
FIG. 6 is a timing chart showing one example of an operation of an column direction error correction in a case where the number of the decode-unsuccessful packets is small in an row direction error correction at a first time.

As shown in FIG. 6, the signal c is always a low level in such a case, and therefore, the error correction is performed with referring to the correction result stored in the flag memory 20. The majority logic circuit 78 is enabled by the signal i, and the high level output designating the correction, which is output from the majority logic circuit 78, is ANDed with the output of the correction result from the flag memory 20 by the AND gate 130. As a result, the high level correction signal r designating the correction is output, and the counter 40 of the corrected bit number counting circuit 38 is counted-up.

Furthermore, the counter 36 of the decode-unsuccessful packet number counting circuit 34 is enabled by the signal m, the counter 36 counts the number of unsuccess flags output from the flag memory 20, i.e. the number of the decode-unsuccessfull packets. In a case of FIG. 6, a total count value of the counter 36 is equal to or lower than a predetermined value, and therefore, the signal q is applied to the error flag circuit 84 as a low level. In this embodiment shown, the threshold value of the number of the successful packets is set as "64", and the predetermined value is set as "209" (=273–64). Therefore, if the count value of the counter 36 is equal to or smaller than "209", it is determined that the number of the successful packets is larger than "64", and the signal q of a low level is output.

In a case of FIG. 6, since the count value is "120", the condition that the count value is equal to or smaller than "209" is satisfied, a frequency that the erroneous correction occurs in the column direction error correction is low. Accordingly, during a processing period indicated by the signal o in the error flag circuit 84, similar to the conventional circuit, the check of the data is performed according to the signal v from the syndrome register 30 and the check result signal u from the CRC check circuit 94. In such a case, the contents of the syndrome register 30 are all zero, and the check result signal u indicating that the data is correct is output from the CRC check circuit 94, and therefore, the decode success signal g of a high level indicating that the decode is successful is output from the error flag circuit 84. Then, the decoded result is saved. In addition, it is possible to evaluate whether or not the number of the decode-successful packets is equal to or larger than the predetermined value by directly counting the number of the decode-successful packets without counting the number of the decode-unsuccessful packets.

Next, with referring to FIG. 7, the column direction error correction in a case where the number of the decode-unsuccessful packets is large as a result of the first-time row direction error correction will be described.

Figure 7:
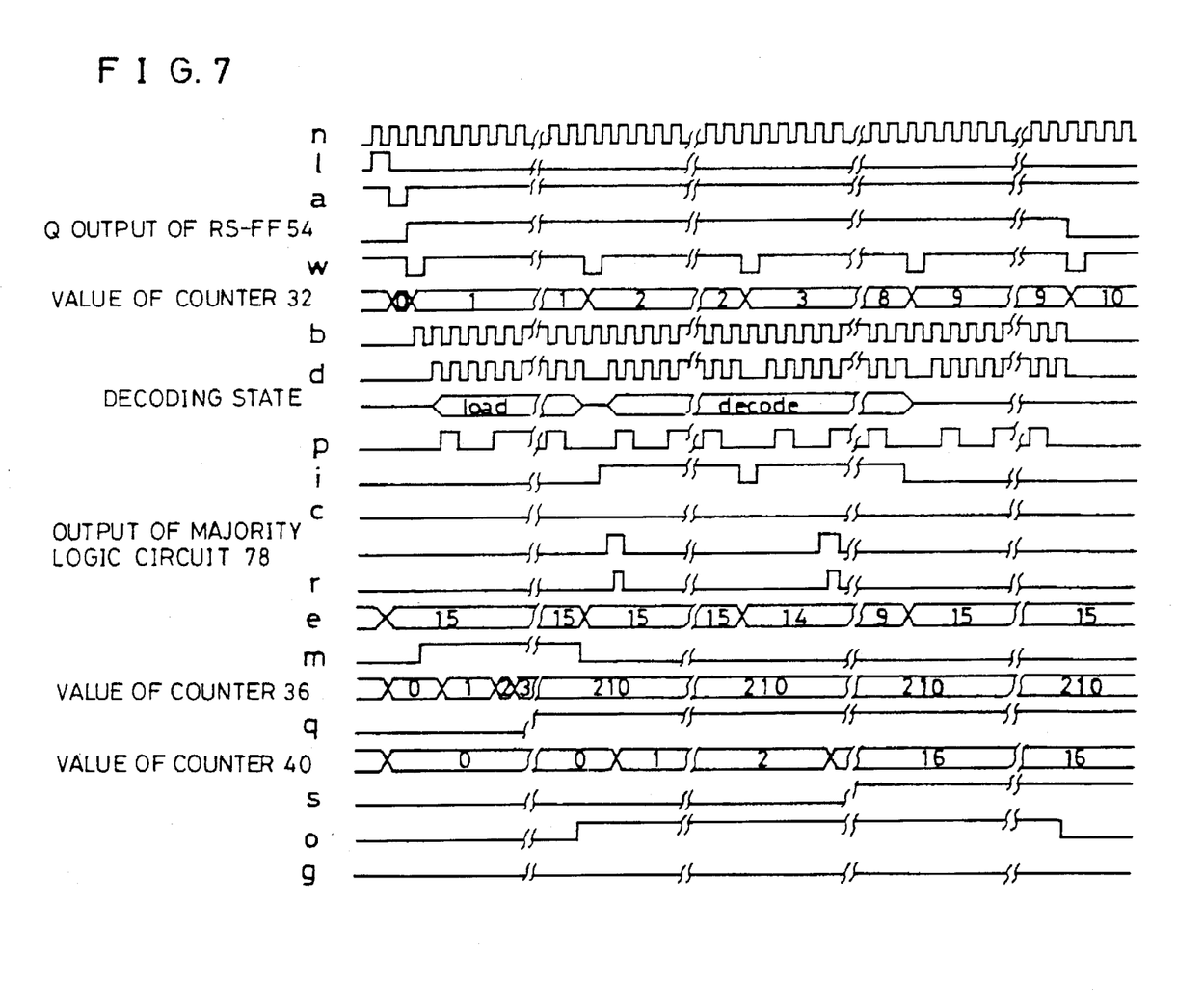
FIG. 7 is a timing chart showing one example of an operation of the column direction error correction in a case where the number of the decode-unsuccessful packets is large in the row direction error correction.

As similar to FIG. 6, as shown in FIG. 7, the correction signal r of a high level by which the correction is designated is applied to the corrected bit number counting circuit 38. In response to the input of the correction signal r, the counter 40 in the corrected bit number counting circuit 38 is counted-up.

Furthermore, the counter 36 of the decode-unsuccessful packet number counting circuit 34 is enabled by the signal m, and the counter 36 counts the number of packets for each of which the decode is unsuccessful in the first-time row direction error correction. In this case shown, the count value of the counter 36 becomes "210". Accordingly, the count value of the counter 36 exceeds the predetermined value of "209", and therefore, the signal q of a high level is applied to the error flag circuit 84. Then, the error flag circuit 84 changes the decode success condition according to the signal s from the corrected bit number counting circuit 38.

More specifically, the decode success condition is changed in accordance with whether or not the counter 40 of the corrected bit number counting circuit 38 indicates a count value equal to or larger than a predetermined value. Then, the predetermined value is set as "16", for example, in the column direction error correction. Therefore, if the counter 40 counts a count value equal to or larger than "16", it is determined that the decode is unsuccessful, and when the count value of the counter 40 is smaller than "16", the processing is performed according to the signal v and the signal m.

In a case of FIG. 7, since the count value of the counter 40 is "16", the condition that the count value is equal to or larger than "16" is satisfied, it is determined that the decode is unsuccessful, and accordingly, the signal g of a low level is output. If the count value of the counter 40 is smaller than "16", in the error flag circuit 84, the check of data is performed in the same way as that of the prior art. In addition, the predetermined value is set as "16", for example, in the column direction error correction; however, the predetermined value may be set as "14", for example, in performing the row direction error correction with respect to a code word not having a strong error-correctability such as the CRC code.

Furthermore, with referring to FIG. 8, the second-time row direction error correction after the column direction error correction will be described.

Figure 8:
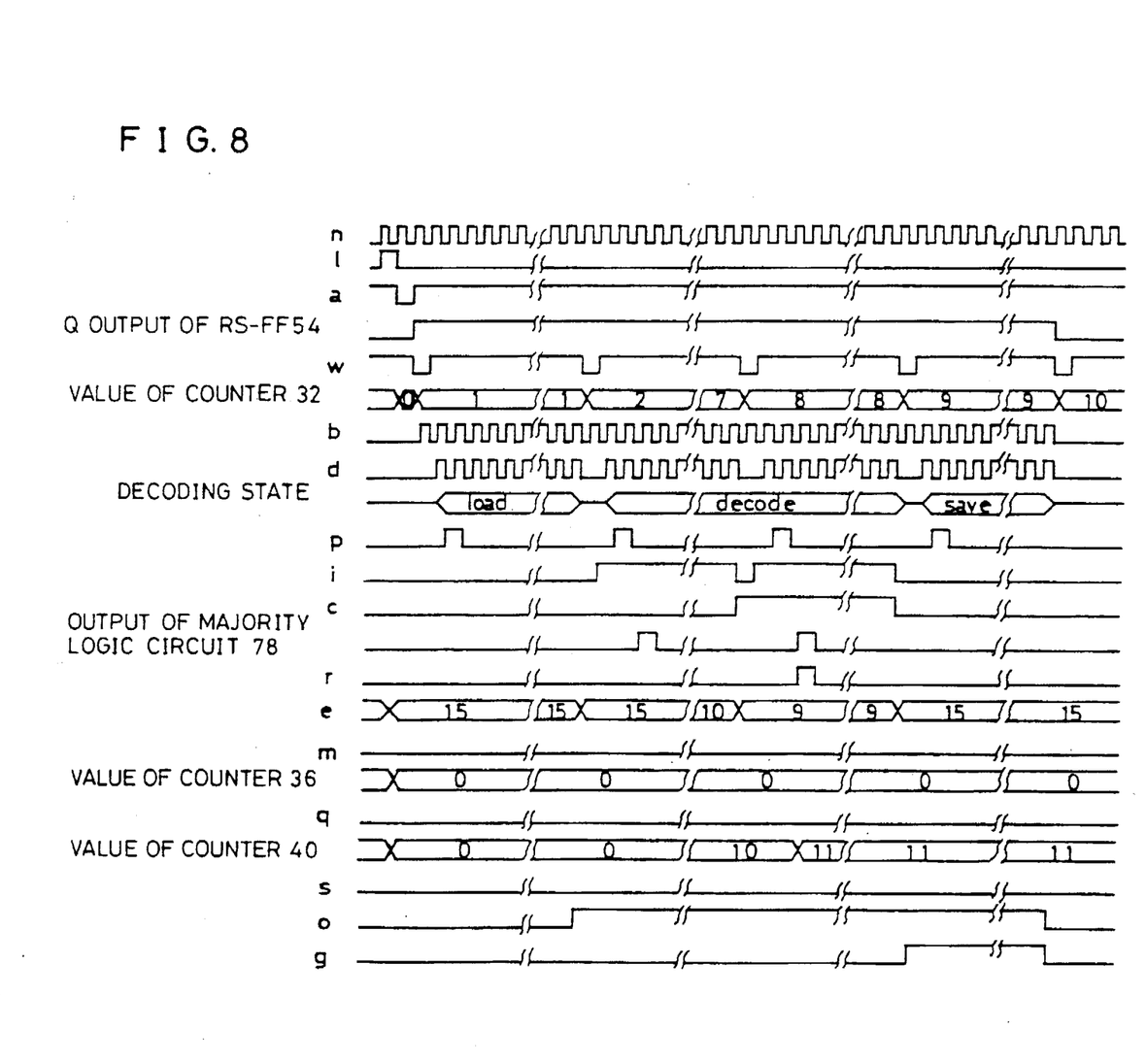
FIG. 8 is a timing chart showing one example of an operation of the row direction error correction after the column direction error correction.

In FIG. 8, the signal c is a low level until a time that the threshold value e applied to the majority logic circuit 78 becomes a predetermined value. The predetermined value of the threshold value e is a minimum value, i.e. "9", for example. Therefore, in this embodiment shown, the signal c is a low level from a time that the threshold value is "15" to a time that the threshold value is "10". In this case, the decode result of the column direction stored in the flag memory 134 is referred to, and an operation similar to that of FIG. 6 or FIG. 7 is performed, and the number of the corrected bits is counted by the corrected bit number counting circuit 38.

Then, if the threshold value e becomes the minimum value, i.e. "9" in this embodiment shown, that is, if the last cycle, the signal c becomes a high level, and therefore, the decode result stored in the flag memory 134 becomes not to be referred to. Therefore, the correction signal r which designates the correction and is output from the majority logic circuit 78 is applied to the corrected bit number counting circuit 38 as it is, and the counter 40 is counted-up. Then, the check of data similar to that of the prior art is performed in the error flag circuit 84 during a period shown by the signal o, and if the decode is successful, the decode success signal g becomes a high level. Then, the data for which the decode is successful is saved.

In accordance with the above described error correcting decoder 10, it is possible to reduce the probability of erroneous correction with a circuit scale smaller than that of the prior art. Furthermore, it is possible to decrease the error rate and to increase the error-correctability because the erroneous correction is prevented from occurring.

More specifically, in the majority logic decoding method utilized in the error correcting decoder 10 for the (272, 190) shortened difference set cyclic code, the syndrome register 30 is affected by the correction of the bit to be determined. Therefore, in a case where the correction is further applied by the majority logic determination with respect to the bit which has been determined to be correct, the influence due to such the erroneous correction is extended to the succeeding bits. Therefore, by removing the bit which has been determined to be correct from the bits to be corrected, the error-correctability is clearly increased.

Therefore, if it is determined, with referring to the result of the first-time row direction error correction at a time that the column direction error correction is to be performed, that a bit for which the first-time row direction error correction is successful, it is possible to remove the bit from the bits to be subjected to the column direction error correction. The reason why the correction result of the first-time row direction error correction can be referred to is as follows: In the data structure of the mobile FM multiplex broadcasting, the CRC of 14 bits is added to the row direction packet, and therefore, the error-correctability of the row direction error correction becomes very large in comparison with the error-correctability of the column direction. The CRC is one of codes or one of combinations of codes having a strong error-correctability. In such a case, if the error correction result of the column direction is unconditionally referred to in performing the second-time row direction error correction, there is a possibility that the error-correctability is decreased, and therefore, at a time that the second-time row direction error correction is to be performed, it is impossible to refer to the correction result of the column direction error correction.

In order to suppress the deterioration of the error rate that is caused by the influence of the erroneous correction in the column direction error correction, it is necessary to reduce the frequency of the erroneous correction in the column direction error correction, or it is necessary to perform the second-time row direction error correction after the column direction error correction with regarding in advance as that the erroneous correction slightly occurs in performing the column direction error correction.

The former utilizes a simple principle that when the number of the error bits caused by a noise is larger, the erroneous correction easily occurs. For example, in comparison with a case where the error correction for packets more than 100 are successful in the first-time row direction error correction, in a case where the error correction for only a few or several packets are successful in the first-time row direction error correction, the frequency of the erroneous correction in the column direction error correction becomes very large. Therefore, in a case where the number of the success packets in the first-time row direction error correction is small, it is necessary to utilize an error correction method by which the erroneous correction is suppressed from occurring in performing the column direction error correction.

As a method for suppressing the erroneous correction in performing the column direction error correction, as shown in the above described embodiments, a method in which it is regarded as that the erroneous correction occurs when the number of the corrected bits in the majority logic decoding method is large in the column direction error correction is effective. Such a method is based on a fact that even if the error correction is successful, it is to be regarded as that the error correction is successful by the erroneous correction because a code word in which the number of the corrected bits is large is originally far from a true code word. However, in a case where the number of the decode successful packets in the first-time row direction error correction is large, it is unnecessary to use such the method. Because in a case where the column direction error correction is performed with referring to the correction result of the first-time row direction error correction, the bit for which the correction of the first-time row direction error correction is successful is not changed during a time that the column direction error correction is being performed, and therefore, a possibility that the error correction is the erroneous correction becomes little.

In addition, the changing of the decode success condition according to the number of the corrected bits can be applied to a decoder for a code which is not a product code but capable of being decoded by the majority logic decoding method. For example, in a case where the number of the corrected bits is large in a teletext broadcasting system, by regarding as that the correction is unsuccessful, the probability of erroneous correction can be reduced.

On the other hand, in the latter method, that is, in a method that the second-time row direction error correction after the column direction error correction is performed by regarding as that the erroneous correction occurs in the column direction error correction, the decode is performed by assuming in advance that the erroneous correction slightly occurs in the column direction error correction and the error correction is successful or unsuccessful with respect to other bits. In such a decoding method, at a timing just after the start of the error correction, due to the influence of the other error bits, for the bit which is an erroneously corrected bit (i.e., the bit for which no error correction is performed by determining that the bit is correct even if the bit is actually in error), there is a case where the number of "1" of the contents of the syndrome register 30 is slightly larger than a half of the contents of the syndrome register 30. Furthermore, for the bit which is assured that no error exist by the column direction error correction and is truly correct by the influences of the other bits, there are many cases where the number of "1" in the syndrome sum input to the majority logic circuit 78 exceeds a half of the number of the syndrome sums of 17 (seventeen) which orthogonally intersects to each other on the starting bit. In such a case, it is impossible to distinguish between the bit being erroneously corrected and the bit being truly correct, and therefore, the error correction is performed with masking such the bit. That is, the error correction is performed with referring to the correction result stored in the flag memory 34. The reason why the error correction can be performed with referring to the flag memory 134 is that the probability that the bit which is subjected to the column direction error correction is correct is larger than the probability of erroneous correction of the (272, 190) code in performing the column direction error correction. In addition, if the latter probability is larger than the former probability, the second-time row direction error correction becomes unsuccessful.

In a case where such a method is utilized, if the error correction is normally proceeded, as the other bits are subjected to the error correction, the number of "1" of the syndrome sums with respect to the erroneously corrected bit becomes larger. That is, in the error correction method where the error correction is performed with making the data register 66 cycle in a plurality of times, such as a variable threshold value decoding method, the possibility that the erroneously corrected bit can be specified is made higher by making the data register cycle. Accordingly, after the cycle of the data register in a plurality of times, by removing the above described mask function, the erroneously corrected bit can be smoothly corrected. In addition, even if a bit which is truly correct is corrected in such a method, it is possible to regard as that the error correction by the CRC within the packet is unsuccessful, and accordingly, the probability of the erroneous correction is very small. Therefore, although in the prior art, it was impossible to sufficiently perform the error correction in a case where the number of the error bits is large; according to the above described embodiment, it is possible to correct a larger number of error bits.

It is clearly understood that the present invention can be applied to a transfer system in which the frame structure wherein the code is made as the product code with utilizing one or two kinds of error correction codes capable of being decoded by the majority logic decoding method is utilized, and the probability of erroneous correction in the row direction error correction is very smaller than the probability of erroneous correction in the column direction error correction.

Furthermore, the present invention can be applied to a transfer system having the frame structure in which the code is made as the product code with utilizing one or two kinds of error correction code capable of being decoded by the majority logic decoding method and the probability of erroneous correction for the column direction error correction code is very smaller than the probability of erroneous correction for the row direction error correction code.

Furthermore, in the above described embodiment, as a code or a combination of codes having a high error-correctability, the CRC is utilized; however, the parity bit or Berger code may be utilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error correcting decoder which decodes a code comprising:

majority logic means for outputting an error correction signal when an error correction for each of bits included in said code is needed; and counting means for counting the number of bits that have been error-corrected on the basis of said error correction signal, wherein said error correction is deemed to be unsuccessful if a count value of said counting means is larger than a first predetermined number.

2. An error correcting decoder according to claim 1, wherein said decoder is utilized in an FM multiplex broadcasting receiver and performs a row direction error correction and a column direction error correction, and said counting means includes a counter which can be incremented by said error correction signal only in performing said column direction error correction.

3. An error correcting decoder which performs a first direction error correction for each of packets having error correction codes and constituting a product code and a second direction error correction for each of cyclic codes constituting said product code in this order, comprising:

first flag memory means for storing a first flag indicative of a result of said first direction error correction;

majority logic means for outputting an error correction signal when an error correction for each of bits included in said cyclic codes is needed in said second direction error correction; and invalidation means for making said error correction signal output from said majority logic means substantially invalid if said first flag indicates that said first direction error correction is successful.

4. An error correcting decoder according to claim 3, wherein said invalidation means includes gating means for gating said error correction signal in response to said first flag.

5. An error correcting decoder according to claim 3 or 4, further comprising first counting means for counting the number of packets for each of which said first direction error correction is unsuccessful; and second counting means for counting the number of bits that have been error-corrected on the basis of said error correction signal in said second direction error correction, wherein said second direction error correction is deemed to be unsuccessful when a count value of said first counting means is larger than a second predetermined value and a count value of said second counting means is equal to or larger than a third predetermined value.

6. An error correcting decoder according to claim 3, wherein after said second direction error correction, said first error correction is performed again, and said decoder further comprises second flag memory means for storing a second flag indicative of an error correction result in said second direction error correction; and variable threshold value setting means for setting a variable threshold value in said majority logic means, and said majority logic means determines whether or not a bit is to be subjected to said second direction error correction with referring to said second flag if said variable threshold value is equal to or larger than a fourth predetermined value and without referring to said second flag if said variable threshold value is smaller than said fourth predetermined value.

7. An error correcting decoder which performs a first direction error correction for each of packets having error correction codes and constituting a product code and a second direction error correction for each of cyclic codes constituting said product code in this order, comprising:

flag memory means for storing a flag indicative of a result of said second direction error correction;

majority logic means for determining whether or not said second direction error correction for each of bits included in said cyclic code is needed on the basis of a variable threshold value and for outputting an error correction signal when said second direction error correction for each of bits included in said cyclic code is needed; wherein if said variable threshold value is equal to or larger than a predetermined value, determination by said majority logic means is performed by referring to said flag, and if said variable threshold value is smaller than said predetermined value, the determination is performed without referring to said flag.

* * * * *